United States Patent
Yayla (10) Patent No.: US 7,221,202 B1
(45) Date of Patent: May 22, 2007

(54) DELAY-LOCKED LOOP WITH REDUCED SUSCEPTIBILITY TO FALSE LOCK

(75) Inventor: Ibrahim Yayla, Delmar, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/201,985

(22) Filed: Aug. 11, 2005

Related U.S. Application Data (60) Provisional application No. 60/610,318, filed on Sep. 15, 2004.

(51) Int. Cl.
*H03L 7/06* (2006.01)
(52) U.S. Cl. ...................................... 327/158; 327/149
(58) Field of Classification Search ...................... None
See application file for complete search history.

(56) References Cited

U.S. PATENT DOCUMENTS 5,463,337 A * 10/1995 Leonowich ................. 327/158
6,400,197 B2 * 6/2002 Lai et al. .................... 327/161
6,466,071 B2 * 10/2002 Kim et al. .................. 327/175
2006/0029175 A1 * 2/2006 Schnarr ...................... 375/376

* cited by examiner

*Primary Examiner*—Timothy P. Callahan
*Assistant Examiner*—Cassandra Cox
(74) *Attorney, Agent, or Firm*—Blakely Sokoloff Taylor & Zafman LLP (57) ABSTRACT

A delay-locked loop ("DLL") having reduced susceptibility to false lock. The DLL includes a delay path coupled to delay an input signal. The delay path includes two or more variable delay cells coupled in series and a feedback node coupled to an output of one of the variable delay cells. An inverter is coupled to receive the input signal and to output an inverted signal. A feedback circuit is coupled to receive the inverted signal from the inverter and to receive a feedback signal from the feedback node. The feedback circuit monitors a phase difference between the inverted signal and the feedback signal to generate a delay control signal in response to the phase difference to adjust a variable delay of the delay path.

17 Claims, 7 Drawing Sheets

DELAY-LOCKED LOOP WITH REDUCED SUSCEPTIBILITY TO FALSE LOCK

CROSS-REFERENCE TO RELATED APPLICATION

This application claims the benefit of U.S. Provisional Application No. 60/610,318, filed on Sep. 15, 2004, the contents of which are incorporated herein by reference.

TECHNICAL FIELD

This disclosure relates generally to electronic circuits, and in particular but not exclusively, relates to delay-locked loop circuits.

BACKGROUND INFORMATION

In an electronic system, good clock distribution is very important to the overall performance of the system. Delay-locked loops ("DLLs") are widely used in communication integrated circuits to generate finely spaced clock phases, multiply clocks, create zero delay buffers, as well as other uses.

Figure 1:
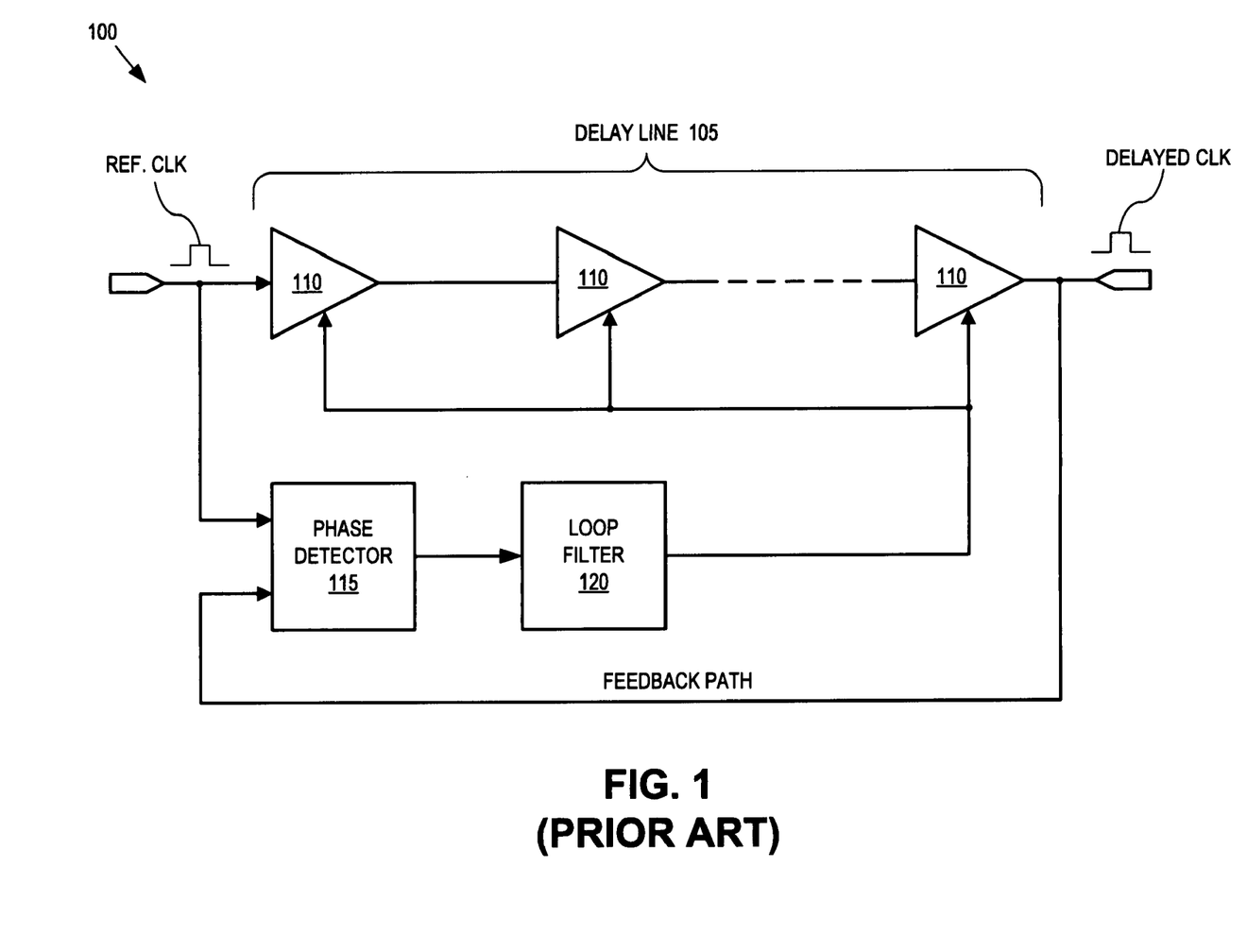
FIG. 1 is a block diagram illustrating a conventional delay-locked loop ("DLL").

A conventional DLL circuit 100 is illustrated in FIG. 1. DLL circuit 100 includes a delay line 105 having multiple delay cells 110, a phase detector 115, and a loop filter 120. During operation, a delayed clock signal output by delay line 105 is phase locked to a one clock period delay of a reference clock signal input to delay line 105. This phase delayed lock is accomplished using a feedback loop. The feedback loops converges to a delay line control voltage that sets the delay through delay line 105 to one full period of the reference clock signal.

Phase detector 115 drives loop filter 120, which in turn controls the delay through delay line 105. The inputs to phase detector 115 are the reference clock received by delay line 105 and the delayed clock signal output from delay line 105. Phase detector 115 and loop filter 120 adjust the delay through the delay line 105 until a rising edge of the reference clock and a rising edge of the delayed clock are aligned. This ensures the delay through delay line 105 is one clock period of the reference clock, which in turn provides clock edges that are evenly spaced through a clock cycle.

Figure 2:
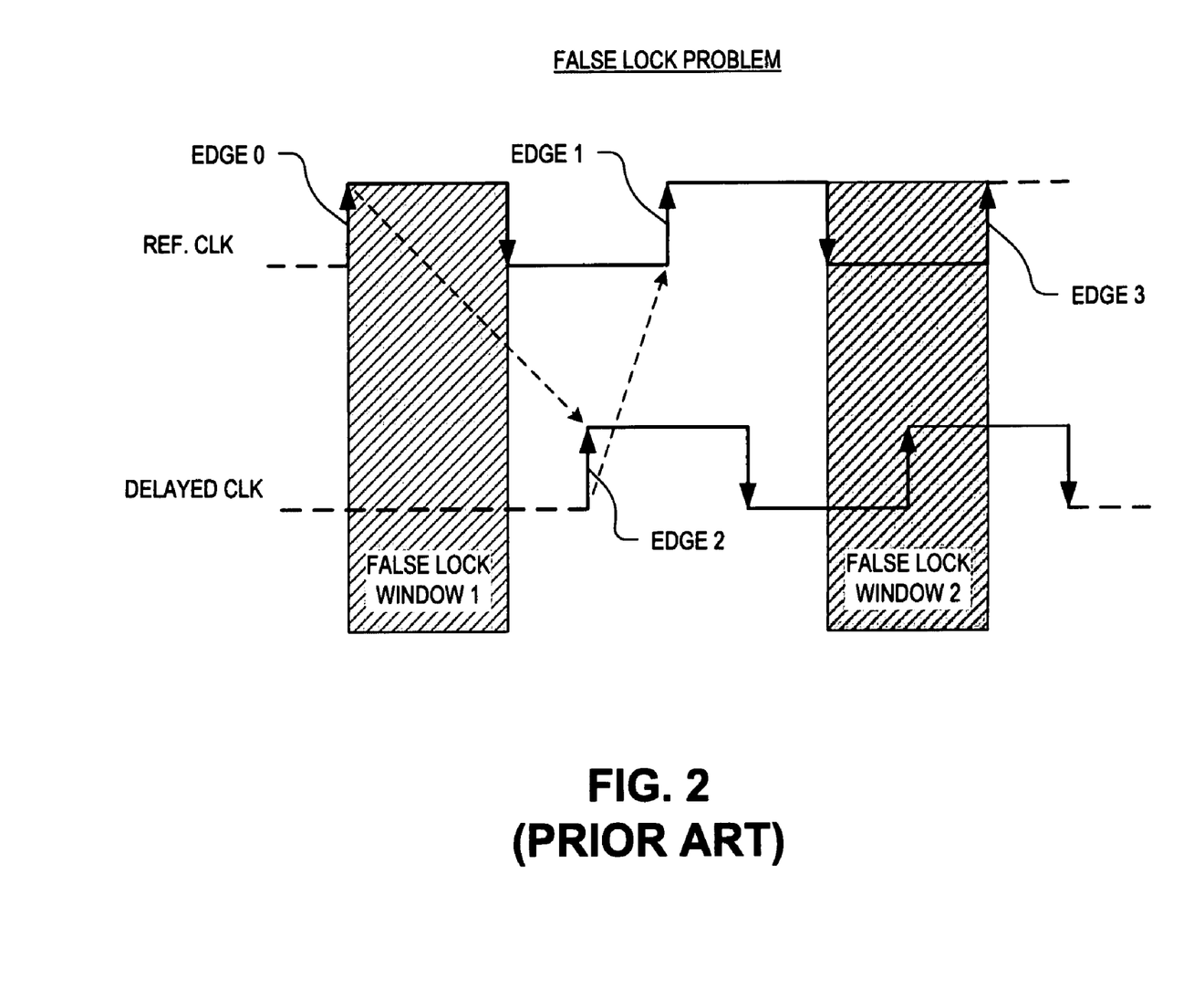
FIG. 2 is a timing diagram illustrating a false lock problem with conventional DLLs.

In order to achieve a stable one clock period delay, the initial delay through delay line 105 (before the negative feed-back takes control) must be well-controlled in order for the loop to converge to the correct state-one clock cycle delay. If the initial delay through delay line 105 is not carefully controlled a false lock condition will occur. As illustrated in FIG. 2, false lock occurs when the initial delay through delay line 105 is either shorter than half of the reference clock period (false lock window 1) or longer than one and a half clock periods (false lock window 2).

If the initial delay through delay line 105 occurs in false lock window 1, then the feedback loop speeds up delay line 105 to align the rising edges of the reference clock (edge 0) and the delayed edge (edge 2—an impossible task as delay line 105 has a minimum delay that cannot physically be reduced to zero. The feedback loop therefore settles to its shortest delay state (less than half a clock period) producing a gross error. If, on the other hand, the initial delay through delay line 105 occurs in false lock window 2, the feedback tries to lock delay line 105 to two clock periods instead of one (i.e., attempts to align edge 2 with edge 3), which also produces an error with heavily distorted waveforms and ultimately complete failure of DLL 100. During proper operation, edge 2 of the delayed clock should eventually align to edge 1 of the reference clock.

Conventional DLLs must guarantee that the initial rising edge 2 of the delayed clock does not occur in one of these two false lock windows (e.g., false lock windows 1 and 2), else the DLL will fail. To avoid false lock windows 1 and 2 during startup, conventional DLLs generally use complex startup circuitry and/or larger more expensive delay cells 110 that more accurately control and constrain the time delay through delay line 105.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a method and apparatus of a delay-locked loop having reduced susceptibility to false lock are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 3:
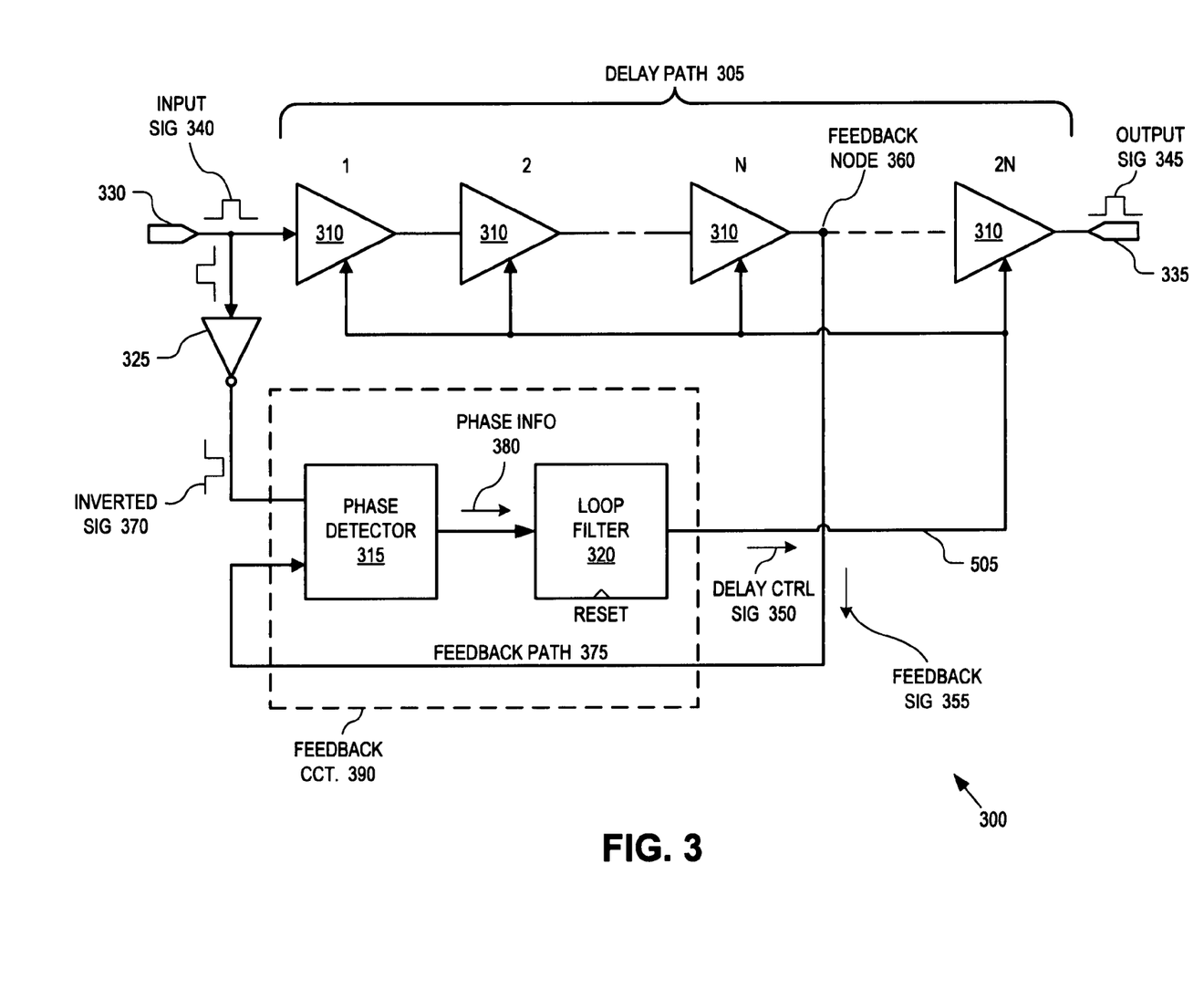
FIG. 3 is a block diagram illustrating a DLL having reduced susceptibility to false lock, in accordance with an embodiment of the invention.

FIG. 3 is a block diagram illustrating a delay-locked loop ("DLL") 300 having reduced susceptibility to false lock, in accordance with an embodiment of the invention. The illustrated embodiment of DLL 300 includes a delay path 305 including delay cells 310, a phase detector 315, a loop filter 320, an inverter 325, an input 330, and an output 335.

The components of DLL 300 are interconnected as follows. Delay cells 310 are coupled in series to provide a variable delay path for input signal 340. A first one of delay cells 310 is coupled to input 330 to receive input signal 340. Input signal 340 may be a reference signal, clock signal, or otherwise. As input signal 340 propagates along delay path 305 it is successively delayed by each delay cell 310 until it is output by a last one of delay cells 310 coupled to output node 335, as output signal 345. Accordingly, output signal 345 is a delayed response to input signal 340.

Delay cells 310 are delay circuits that can each delay input signal 340 by a variable amount in response to a delay control signal 350. In one embodiment, delay cells 310 are voltage controlled delay buffers. Delay path 305 may include any number of delay cells 310. In one embodiment, delay path 305 includes an even number 2N of delay cells 310 coupled in series, where N is positive integer.

A feedback signal 355 is picked off of delay path 305 at a feedback node 360. In one embodiment, feedback node 360 is positioned at halfway delay point along delay path 305. In the illustrated embodiment, feedback node 360 is coupled to the output of the Nth delay cell 310. Accordingly, in the illustrated embodiment, there are N delay cells 310 before feedback node 360 and N delay cells 310 after feedback node 360. In the illustrated embodiment, feedback signal 355 is also a delayed response to input signal 340 having a delay approximately equal to half the delay of output signal 345.

Inverter 325 is coupled to input 330 to receive input signal 340 and generate inverted signal 370. Phase detector 315 is coupled to the output of inverter 325 to receive inverted signal 370. Phase detector 315 is further coupled to a feedback path 375, which is coupled to feedback node 360 to deliver feedback signal 355 to phase detector 315. Phase detector 315 receives inverted signal 370 and feedback signal 355 and generates phase information 380 indicative of a phase difference between inverted signal 370 and feedback signal 355.

Loop filter 320 is coupled to phase detector 315 to receive phase information 380. In response to phase information 380, loop filter 320 generates delay control signal 350. Delay control signal 350 is a sort of error signal for controlling the delay of delay path 305. In one embodiment, delay control signal 350 is an analog voltage signal. Feedback path 375, phase detector 315, and loop filter 320 form a negative feedback loop for phase locking output signal 345 to input signal 340. Phase detector 315 and loop filter 320 may collectively be referred to as a feedback circuit 390. It should be appreciated that a variety of different circuit elements not illustrated may be used to implement the functionality of feedback circuit 390.

In one embodiment, phase information 380 is a series of positive or negative pulses. A positive pulse may indicate that a phase of output signal 345 lags a target phase lock relative to input signal 340, while a negative pulse may indicate that the phase of output signal 345 is leading the target phase lock relative to input signal 340. In one embodiment, loop filter 320 integrates these positive and negative pulses to generate delay control signal 350.

Using DLL 300, delayed phase lock is achieved by feeding back phase information at the center of delay path 305. However, to correct the feedback polarity of the feedback loop, inverter 325 inverts input signal 340 to generate inverter signal 370, which is then provided to phase detector 315, instead of input signal 340 itself. This results in locking the phase delay at feedback node 360 (e.g., halfway phase delay of delay path 305) to half of the clock period of input signal 340.

Figure 4:
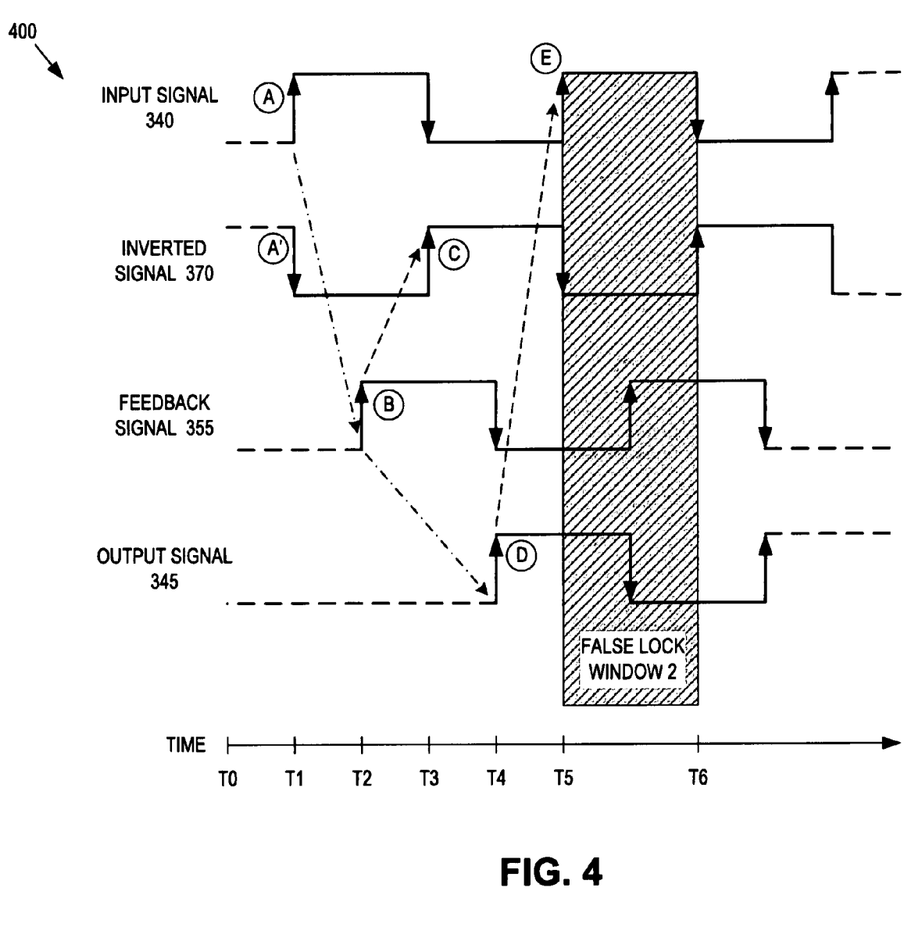
FIG. 4 is a timing diagram illustrating reduced susceptibility to false lock of a DLL, in accordance with an embodiment of the invention.

FIG. 4 is a timing diagram 400 illustrating DLL 300's reduced susceptibility to the false lock problem, in accordance with an embodiment of the invention. FIG. 4 illustrates an example relation between input signal 340, inverted signal 370, feedback signal 355, and output signal 335. At time T1, edge A of input signal 340 arrives at input 330. Also at time T1, inverter 325 inverts edge A of input signal 340 to generate edge A' of inverted signal 370. At time T2, input signal 340 has propagated through delay path 305 to feedback node 360 to generate edge B of feedback signal 355.

DLL 300 acts to lock to a state where the delay through delay path 305 is half of one period or cycle of input signal 340, as opposed to a full cycle. As a result, DLL 300 converges to the correct phase delay from any initial delay that is shorter than one period of input signal 340. This can be seen in FIG. 4. If the initial phase delay of delay path 305 is less than half of one cycle of input signal 340, then phase detector 315 generates a negative pulse for phase information 380 that slows down delay path 305 (i.e., increases the delay through delay path 305) to align edge B of feedback signal 355 with edge C of inverted signal 370. If on the other hand, the initial phase delay through delay path 305 is more than half a cycle of input signal 340 (but less than one cycle), then phase detector 315 generates a positive pulse for phase information 380 that speeds up delay path 305 (i.e., reduces the delay through delay path 305) to align edge B with edge C. Since in the illustrated embodiment of DLL 300 feedback node 360 is positioned at the halfway delay point along delay path 305, once edge B of feedback signal 355 is aligned with edge C of inverted signal 370, then edge D of output signal 345 is aligned with edge E of input signal 340. Therefore, output signal 345 is a phase locked, one cycle delayed response to input signal 340.

In one embodiment, operation of feedback circuit 390 may be summarized as follows. If rising edge B of feedback signal 355 occurs during a LOW logic state of input signal 340, delay control signal 350 is adjusted to increase the delay through delay path 305. If rising edge B of feedback signal 355 occurs during a HIGH logic state of input signal 340, delay control signal 350 is adjusted to decrease the delay through delay path 305.

DLL 300 will converge to the correct phase delay (e.g., one period delay) as long as the initial delay is less than one period or cycle of input signal 340. Accordingly, DLL 300 eliminates the first false lock window 1, illustrated in FIG. 2. Instead, DLL 300 is susceptible to a single false lock window ranging from 1 to 1.5 cycles of input signal 340 (illustrated as the period between times T5 and T6). However, avoiding a single false lock window is substantially easier than avoiding two false lock windows. Since there is no minimum requirement for the initial delay of delay path 305, in one embodiment, the initial delay is set to it's shortest possible delay. Setting the initial delay to the shortest possible delay ensures that the initial delay stays shorter than a full cycle of input signal 340, thereby avoiding the second false lock window. Note, the same cannot be said of DLL 100 illustrated in FIG. 1. Setting the initial delay of DLL 100 to its minimum delay would produce an initial phase residing within the false lock window 1 (see FIG. 2).

Figure 5:
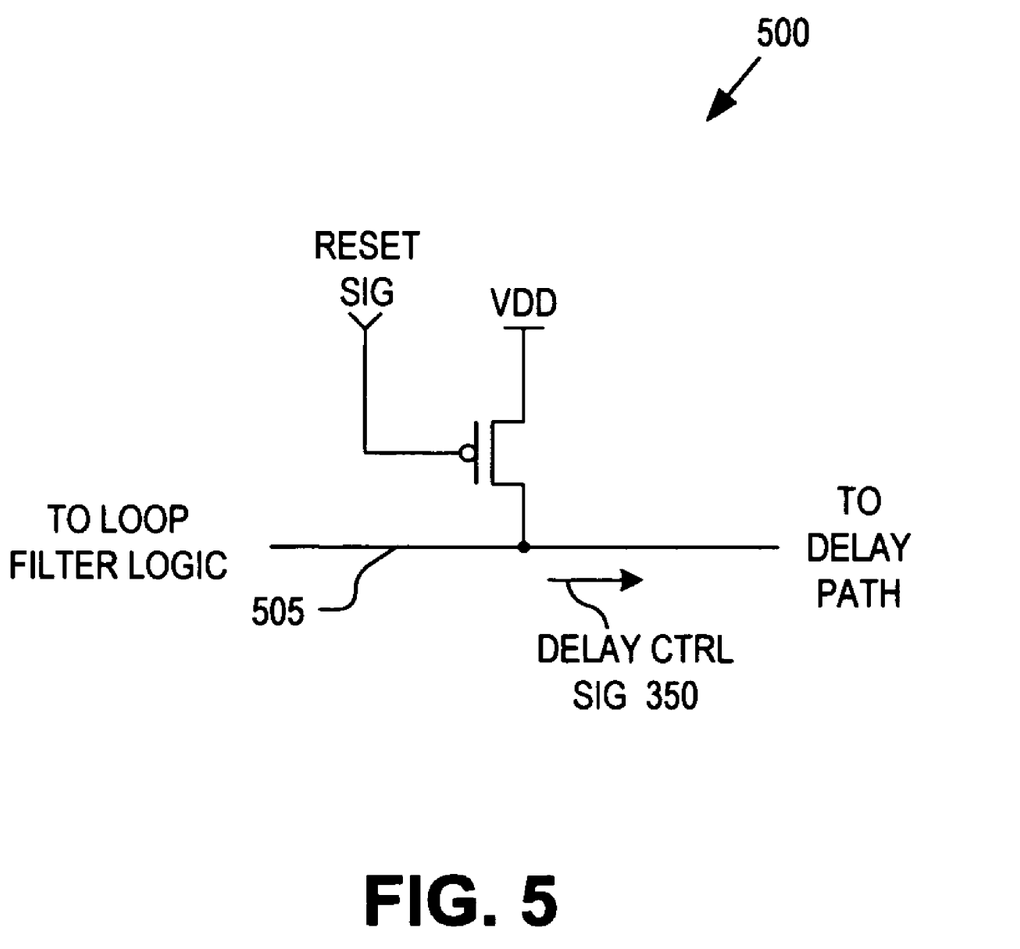
FIG. 5 is a circuit diagram illustrating a startup circuit of a DLL having reduced susceptibility to false lock, in accordance with an embodiment of the invention.

FIG. 5 is a circuit diagram illustrating a startup circuit 500 for use with DLL 300, in accordance with an embodiment of the invention. Startup circuit 500 is one possible embodiment of a startup circuit for DLL 300. In one embodiment, startup circuit 500 is included within loop filter 320 and is coupled to receive the same reset signal as received by loop filter 320 and possibly other subcomponents of DLL 300.

Startup circuit 500 includes a transistor (e.g., PMOS transistor) coupled between a voltage rail and a control path 505 for carrying delay control signal 350.

During regular operation or steady state operation of DLL 300, the transistor is disabled or open circuited and therefore control path 505 is controlled by loop filter logic of loop filter 320. Upon assertion of the reset signal, the transistor is enabled or closed circuited, coupling control path 505 to the voltage rail VDD. Coupling control path 505 to the voltage rail VDD places delay cells 310 into their fastest or smallest delay state. Upon de-assertion of the reset signal, the loop filter logic takes over control and DLL 300 trends towards its steady state operation or lock state. FIG. 5 illustrates a LOW enabled reset signal; however, it should be appreciated startup circuit 500 can be modified to use a HIGH enabled reset signal by coupling an inverter to the base (or gate) of the transistor.

Returning to FIG. 3, DLL 300 is illustrated with feedback node 360 placed at the halfway delay point of delay path 305. However, other embodiments of DLL 300 may include placement of feedback node 360 at various other locations along delay path 305 to generate various different shifted phased locked delays. For example, feedback node 360 may be positioned to achieve phased locked delays equal to 0.25, 0.333, 0.5, 0.667, 0.75, 1.75 or otherwise of a cycle of input signal 340. Furthermore, the resolution or granularity for the selection of this alternative phased locked delay is determined by the number of delay cells 310 within delay path 305.

Figure 6:
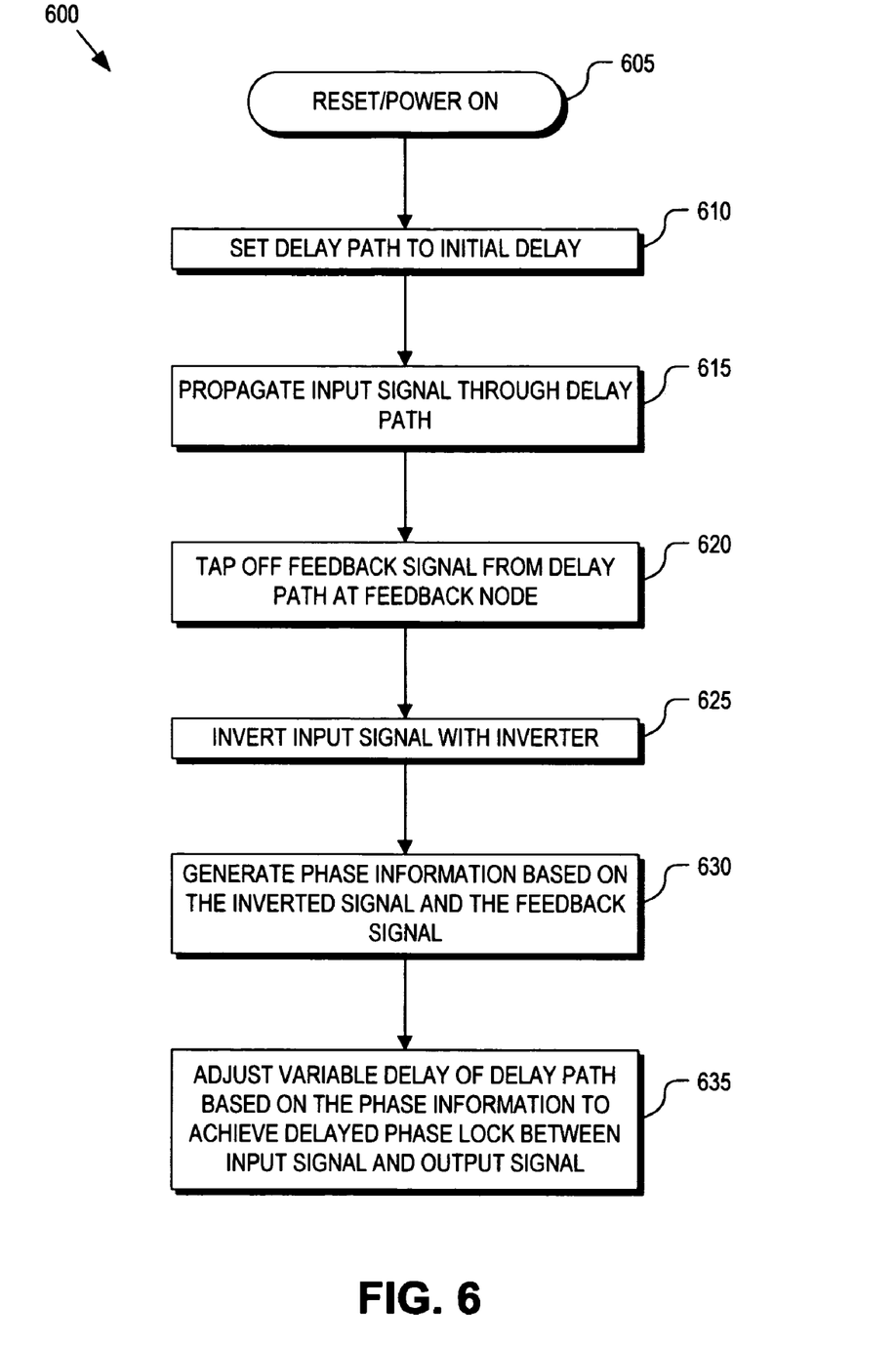
FIG. 6 is a flow chart illustrating a process of operation for a DLL having reduced susceptibility to false lock, in accordance with an embodiment of the invention.

FIG. 6 is a flow chart illustrating a process 600 for operation of DLL 300, in accordance with an embodiment of the invention. The order in which some or all of the process blocks appear in each process should not be deemed limiting. Rather, one of ordinary skill in the art having the benefit of the present disclosure will understand that some of the process blocks may be executed in a variety of orders not illustrated or even concurrently.

In a process block 605, operation of DLL 300 is initiated via a reset or power on operation. During startup, the reset signal is received by loop filter 320. In response to the reset signal, loop filter 320 applies a delay control signal 350 to delay cells 310, setting delay path 305 to a delay which is outside of the false lock window 2 illustrated in FIG. 4 (process block 610). In one embodiment, the initial value of delay control signal 350 causes delay path 305 to initialize to a minimum delay.

In a process block 615, input signal 340 is received at input 330 and propagates through delay path 305 being successively delayed by each delay cell 310 before reaching feedback node 360 as feedback signal 355 and reaching output 335 as output signal 345. In a process block 620, feedback signal 355 is tapped off delay path 305 at feedback node 360 and provided as an input to phase detector 315. In a process block 625, input signal 340 is inverted by inverter 325 to generate inverted signal 370. Inverted signal 370 is also provided as an input to phase detector 315.

In a process block 630, phase detector 315 generates phase information 380 based on the phase difference between inverted signal 370 and feedback signal 355. Because phase detector 315 is coupled to inverted signal 370 and because feedback signal 355 is tapped off at the halfway delay point of delay path 305, phase detector 315 measures the phase difference between half of a clock period of input signal 340 and half of the delay of delay path 305.

In a process block 635, loop filter 320 adjusts the variable delay of delay cells 310 via delay control signal 350. Delay control signal 350 is adjusted based on phase information 380 received from phase detector 315 to achieve a delayed phase lock between input signal 340 and output signal 345. Feedback signal 355 continues to provide negative feedback along feedback path 375 while DLL 300 achieves a delayed phase lock. In the illustrated embodiment of DLL 300, half of delay line 305 is locked to a half period of input signal 340, which effects a lock between the full delay line 305 and the full period of input signal 340, but eliminates the first false lock window illustrated in FIG. 2.

Figure 7:
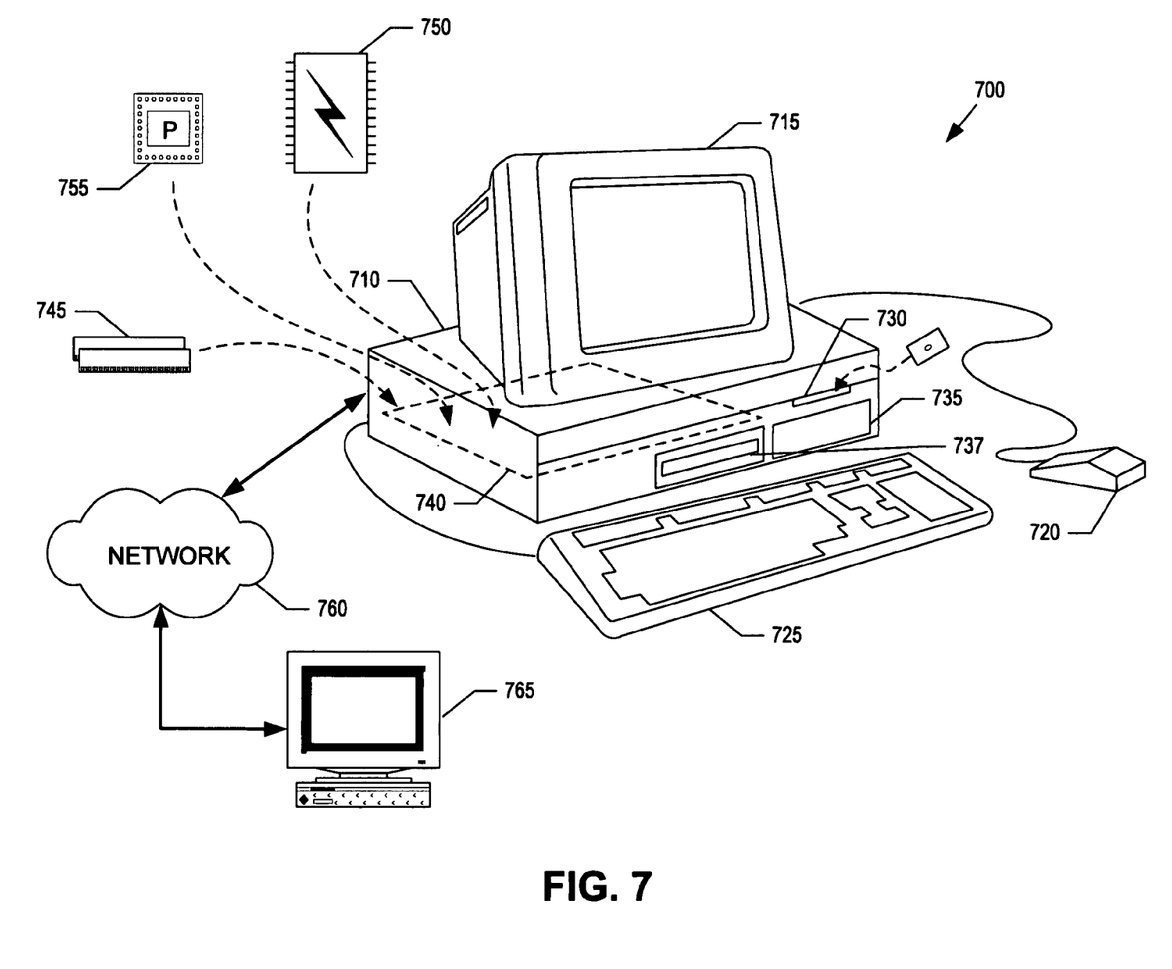
FIG. 7 illustrates a demonstrative system implemented using an embodiment of the invention.

FIG. 7 illustrates a demonstrative system 700 implemented using an embodiment of the invention. The illustrated embodiment of system 700 includes a chassis 710, a monitor 715, a mouse 720 (or other pointing device), and a keyboard 725. The illustrated embodiment of chassis 710 further includes a floppy disk drive 730, a hard disk 735, a compact disc ("CD") and/or digital video disc ("DVD") drive 737, a power supply (not shown), and a motherboard 740 populated with appropriate integrated circuits including system memory 745, nonvolatile ("NV") memory 750, and one or more processor(s) 755.

Processor(s) 755 is communicatively coupled to system memory 745, NV memory 750, hard disk 735, floppy disk drive 730, and CD/DVD drive 737 via a chipset on motherboard 740 to send and to receive instructions or data thereto/therefrom. In one embodiment, NV memory 750 is a flash memory device. In other embodiments, NV memory 750 includes any one of read only memory ("ROM"), programmable ROM, erasable programmable ROM, electrically erasable programmable ROM, or the like. In one embodiment, system memory 745 includes random access memory ("RAM"), such as dynamic RAM ("DRAM"), synchronous DRAM, ("SDRAM"), double data rate SDRAM ("DDR SDRAM") static RAM ("SRAM"), and the like. Hard disk 735 represents any storage device for software data, applications, and/or operating systems, but will most typically be a nonvolatile storage device. Hard disk 735 may optionally include one or more of an integrated drive electronic ("IDDE") hard disk, an enhanced IDE ("EIDE") hard disk, a redundant array of independent disks ("RAID"), a small computer system interface ("SCSI") hard disk, and the like.

In one embodiment, a network interface card ("NIC") (not shown) is coupled to an expansion slot (not shown) of motherboard 740. The NIC is for connecting system 700 to a network 760, such as a local area network, wide area network, or the Internet. In one embodiment network 760 is further coupled to a remote computer 765, such that system 700 and remote computer 765 can communicate.

DLL 300 may be incorporated into processor 755, as well as, various other integrated circuits (e.g., digital signal processing chips, digital telecommunication circuits, phase recovery circuits, etc.) for generating finely spaced clock phases, multiplying clocks, creating zero delay buffers (e.g., one clock cycle delay buffers), and the like. DLL 300 may be incorporated into NICs of system 700 and/or remote computer 765 for extracting clock signals and/or recovering phase information from transmission signals communicated between the two systems.

Descriptions of DLL 300 may be generated and compiled for incorporation into processor 755 or other various application specific integrated circuits ("ASICs"). For example, behavioral level code describing DLL 300, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe embodiments of DLL 300.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
    a delay path coupled to delay an input signal, the delay path including two or more variable delay cells coupled in series and a feedback node coupled to an output of one of the variable delay cells, wherein the delay path includes 2·N variable delay cells, where N is a positive integer, and wherein the feedback node is coupled to the output of the Nth one of the variable delay cells;
    an inverter coupled to receive the input signal and output an inverted signal; and
    a feedback circuit coupled to the inverter to receive the inverted signal and coupled to the feedback node to receive a feedback signal, the feedback circuit coupled to monitor a phase difference between the inverted signal and the feedback signal and to generate a delay control signal in response to the phase difference to adjust a variable delay of the delay path.

2. The apparatus of claim 1, wherein the delay path, the inverter, the feedback circuit comprise a delay-locked loop, and wherein the feedback circuit includes:
    a phase detector coupled to receive the inverted signal and to receive the feedback signal from the feedback node to generate phase information indicative of the phase difference between the inverted signal and the feedback signal; and
    a loop filter coupled to the phase detector to receive the phase information and to generate the delay control signal in response to the phase information to adjust the variable delay of the delay path.

3. The apparatus of claim 1, wherein the delay path further comprises:
    an input coupled to the inverter and to a first one of the variable delay cells, the input to receive the input signal; and
    an output coupled to a last one of the variable delay cells, the output to output an output signal being a phase locked delay of the input signal.

4. The apparatus of claim 1, wherein the variable delay cells comprise voltage controlled delay buffers.

5. The apparatus of claim 4, wherein the delay control signal generated by the feedback circuit comprises an analog error signal.

6. The apparatus of claim 1, wherein the feedback node is positioned at a halfway delay point of the delay path.

7. The apparatus of claim 1, wherein the feedback circuit includes a startup circuit to drive the delay control signal to a value that causes the delay path to have a minimum delay during a startup phase.

8. The apparatus of claim 7, wherein the startup circuit comprises:
    a reset input to receive a reset signal; and
    a transistor coupled to selectively connect the delay control signal to a voltage rail in response to the reset signal.

9. The apparatus of claim 2, wherein the delay-locked loop is included within a phase recovery circuit of a digital communication circuit.

10. A method, comprising:
    propagating an input signal through a delay path of a delay-locked loop ("DLL") to generate an output signal;
    tapping off a feedback signal from an intermediate point along the delay path;
    inverting the input signal to generate an inverted input signal;
    generating phase information based on the inverted input signal and the feedback signal; and
    adjusting a variable delay of the delay path based on the phase information to achieve a delayed phase lock between the input signal and the output signal.

11. The method of claim 10, wherein the intermediate point of the delay path has a first delay approximately equal to half of a second delay at an output of the delay path.

12. The method of claim 11, wherein propagating the input signal through the delay path comprises propagating the input signal through a plurality of variable delay cells coupled in series.

13. The method of claim 10, further comprising setting a delay of the delay path to a minimum delay during a startup phase of the DLL.

14. A machine-accessible medium having contained thereon a description of an integrated circuit, the integrated circuit comprising:
    a delay path coupled to delay an input signal, the delay path including two or more variable delay cells coupled in series and a feedback node coupled to an output of one of the variable delay cells;
    an inverter coupled to receive the input signal and output an inverted signal; and
    a feedback circuit coupled to the inverter to receive the inverted signal and coupled to the feedback node to receive a feedback signal, the feedback circuit coupled to monitor a phase difference between the inverted signal and the feedback signal and to generate a delay control signal in response to the phase difference to adjust a variable delay of the delay path, the feedback circuit including a startup circuit to drive the delay control signal to a value that causes the delay path to have a minimum delay during a startup phase.

15. The machine-accessible medium of claim 14, wherein the delay path further comprises:
    an input coupled to the inverter and to a first one of the variable delay cells, the input to receive the input signal; and
    an output coupled to a last one of the variable delay cells, the output an output signal being a phase locked delay of the input signal.

16. The machine-accessible medium of claim 15, wherein the delay path includes 2·N variable delay cells, where N is a positive integer, and wherein the feedback node is coupled to the output of the Nth one of the variable delay cells.

17. The machine-accessible medium of claim 14, wherein the feedback node is positioned at a halfway delay point of the delay path.

\* \* \* \* \*